(12) United States Patent
Gandrud et al.

(10) Patent No.: US 7,317,290 B2
(45) Date of Patent: Jan. 8, 2008

(54) TANDEM BATTERY POWERED INVERTER AND METHOD OF IMPLEMENTING THE SAME

(75) Inventors: Michael D Gandrud, Ames, IA (US); Torben Frederiksen, Augustenborg (DK); Jeff Herrin, Ankeny, IA (US)

(73) Assignee: Sauer-Danfoss Inc., Ames, IA (US)

( * ) Notice: Subject to any disclaimer, the term of this patent is extended or adjusted under 35 U.S.C. 154(b) by 471 days.

(21) Appl. No.: 11/025,331

(22) Filed: Dec. 29, 2004

(65) Prior Publication Data

US 2006/0138993 A1    Jun. 29, 2006

(51) Int. Cl.
H02P 1/54    (2006.01)
H02P 5/00    (2006.01)
H02P 5/46    (2006.01)

(52) U.S. Cl. ...................... 318/105; 318/139
(58) Field of Classification Search ............ 318/105
See application file for complete search history.

(56) References Cited

U.S. PATENT DOCUMENTS

| | | | |
|---|---|---|---|
| 4,961,042 A | 10/1990 | Imaseki | |
| 5,619,111 A * | 4/1997 | Katagiri et al. | 318/625 |
| 5,789,879 A * | 8/1998 | Cook | 318/101 |
| 6,476,572 B2 | 11/2002 | Lounsbury | |
| 6,486,632 B2 * | 11/2002 | Okushima et al. | 318/599 |
| 6,604,601 B2 | 8/2003 | Steele | |
| 6,838,839 B2 * | 1/2005 | Goto et al. | 318/139 |
| 6,906,479 B2 * | 6/2005 | Xu et al. | 318/140 |
| 2002/0033689 A1* | 3/2002 | Minagawa et al. | 318/801 |
| 2002/0140390 A1 | 10/2002 | Lounsbury | |
| 2003/0075376 A1 | 4/2003 | Steele | |

FOREIGN PATENT DOCUMENTS

JP    02002223589 A    8/2002

* cited by examiner

*Primary Examiner*—Lincoln Donovan
*Assistant Examiner*—Erick Glass

(57) ABSTRACT

AC inverters that are electrically connected to a direct current source to convert the direct current source such that the transistor power module of an inverter can power a plurality of AC motors wherein the motors can be located remote from the inverters or within the inverter housings.

17 Claims, 10 Drawing Sheets

TANDEM BATTERY POWERED INVERTER AND METHOD OF IMPLEMENTING THE SAME

BACKGROUND OF THE INVENTION

This invention relates to electrically powered fork lift trucks. More specifically, the present invention relates to alternating current inverters and motors for such trucks.

Industrial trucks such as forklift trucks are used for transporting heavy materials within warehouses, for stacking goods, and for other well known useful purposes. Such industrial trucks are often powered by a large lead acid battery. In such trucks electric motors are used to convert the battery's electrical power for propelling the machine, lifting the pay load, steering the machine, and for other useful purposes. Recent technology improvements in solid state power electronics have made the use of alternating current (AC) electrical motors a practicality through the advent of improved inverters. Battery powered inverters are an electronic device that convert the battery's direct current energy into three phase alternating current energy of an adjustable frequency and adjustable voltage level to create the desired performance of an electrical motor. The same functions are sometimes accomplished through the use of fuel cell power sources, hybrid, and other electrical power sources. The present invention applies to all electrically powered industrial trucks regardless of chemistry of a storage battery that is used with any other source of the electrical power.

In current forklift trucks, multiple electric motors that use multiple AC inverters are used. The system cost of using one inverter for each motor can be excessive. In many cases, the inverter cost is a serious drawback for OEMs (original equipment manufacturers) that want to go to maintenance free AC solutions. Consequently, problems remain in the art regarding the cost of using a plurality of motors, and regarding the amount of space the extra inverters take up in order to supply power to extra motors.

Therefore, there is a need in the art for an inverter that will be battery powered from a truck's lead acid battery that will have a power module that is able to power a plurality of motors. Additionally, there is a need in the art to provide for such a power module that will allow an inverter to be housed within the motor. Also, there is a need for a system that will properly cool this power module to ensure proper functioning.

Additionally, there is a need in the art for a means of configuring a single power module to independently control two electric motors. Due to the high cost of tooling that would be required to produce a completely new power module design, it is important to provide means of producing a tandem power module which uses existing power module packaging designs. To further reduce the cost of providing multiple models of inverters with a minimum number of different power modules, there is also a need in the art to optionally use a single power module design to either power a single electric motor of a higher current draw rating. In this manner the present invention teaches a means of producing a single power module that may be used in either a tandem inverter of moderate rating or in a single inverter of higher rating.

Therefore, it is a principal object of the present invention to provide an improved inverter that allows the inverter to power a plurality of motors.

Yet another object of the present invention is to provide for a cooling system that uses hydraulic fluid in order to cool the inverter.

Yet another object of the present invention is to provide for a cooling system that uses hydraulic fluid in order to cool the inverter.

Still another object of the present invention is to provide a single power module that may optionally be connected to supply a single electric motor of high current draw.

Yet another object of the present invention is to provide a single power module that may optionally be connected to control more than one electric motor of moderate to current draw.

These and other objects, features, or advantages of the present invention will become apparent from the specification and claims.

BRIEF SUMMARY OF THE INVENTION

Improved alternating current inverters that are used within a forklift. The inverters have a housing that is connected to a direct current source such as the battery of a forklift. An inverter has a plurality of power switching transistors such as MOSFETS (metal oxide semi-conductor field effect transistors) that are able to support a plurality of alternating current motors that are in communication with the housing. Optionally, one of the plurality of motors can be housed within the inverter housing, thus a direct current source can be used to power a plurality of alternating current motors by using a single inverter. Additionally, the invention provides for a fluid cooling system that uses hydraulic fluid to cool the inverter.

DESCRIPTION OF THE PREFERRED EMBODIMENTS OF THE INVENTION

Figure 1:
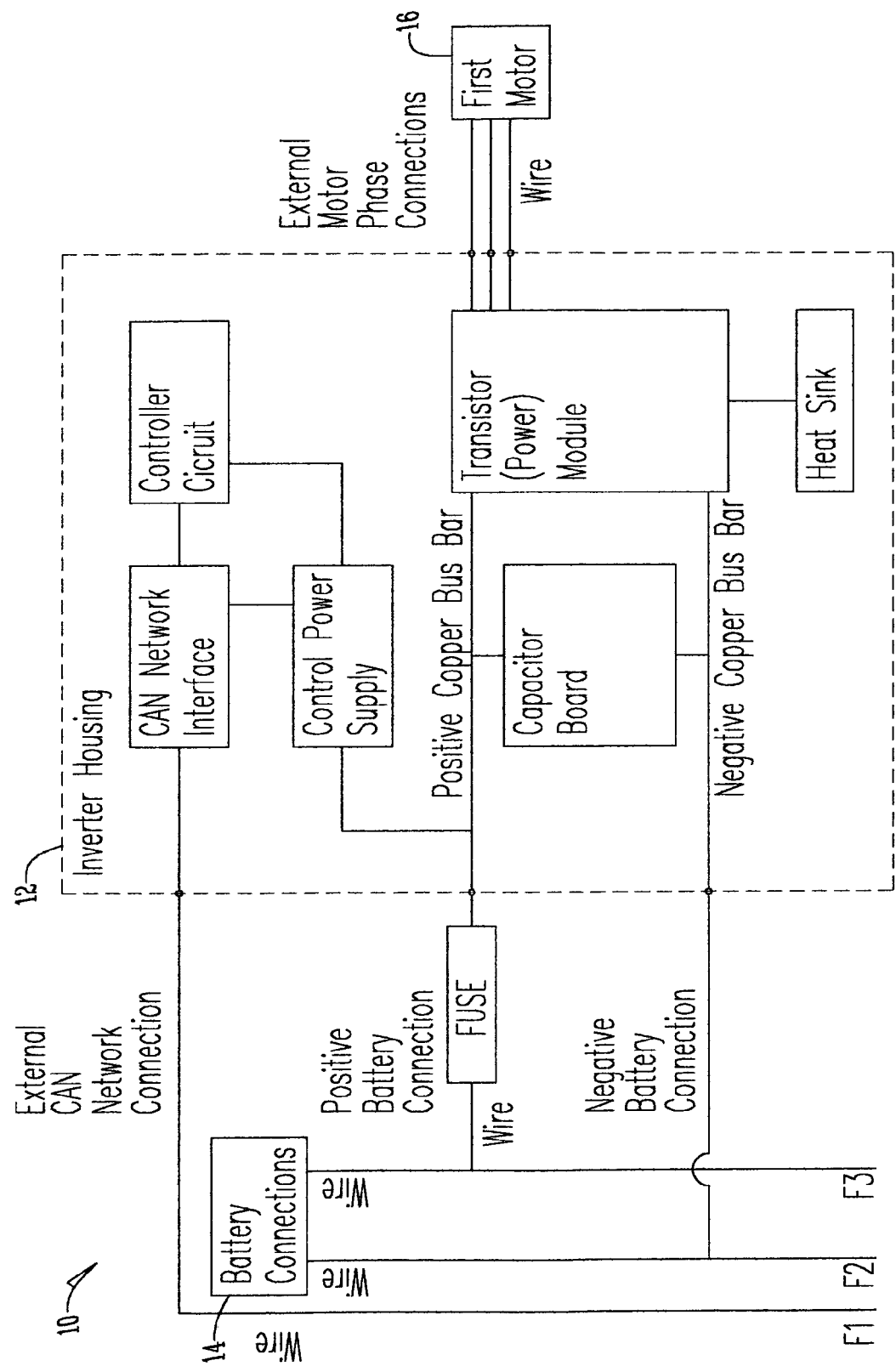
FIG. 1 is a schematic diagram illustrating a prior art alternating current inverter system.
Figure 1A:
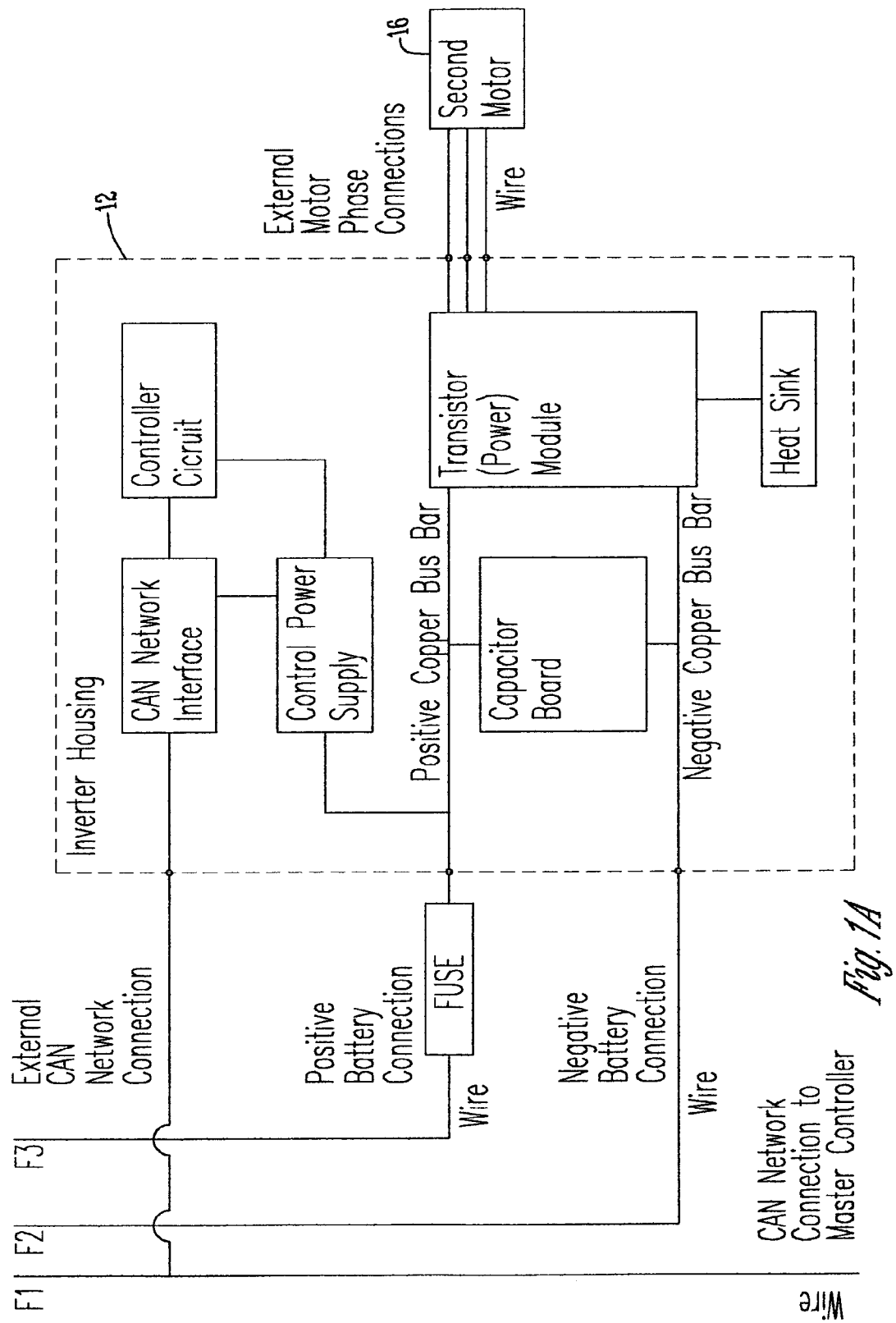
FIG. 1A is a schematic diagram illustrating a prior art alternating current inverter system continued from FIG. 1 along lines F1, F2 and F3.

With reference to FIG. 1, a conventional alternating current (AC) inverter system 10 is shown having an AC inverter 12, a direct current (DC) source 14 such as a lead acid battery, a fuel cell, or a hy-bred direct current power source; and an electric motor 16 such as an AC motor that can be operated as an electrical generator. Prior art devices such as that shown in FIG. 1 teach connecting each AC motor 16 to a separate AC inverter 12.

Figure 2:
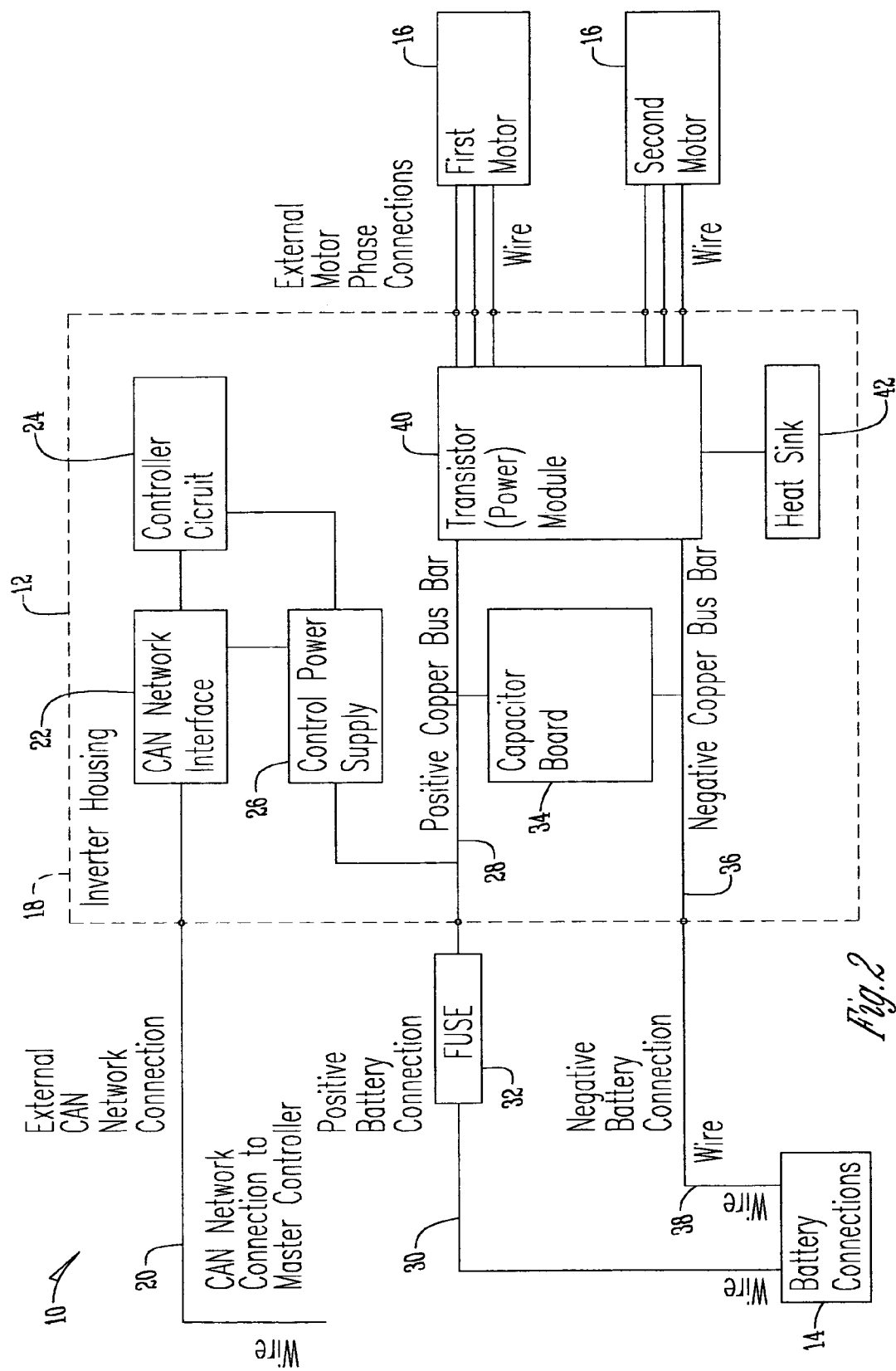
FIG. 2 is a schematic diagram of an embodiment of an alternating current inverter system.

With reference to FIG. 2, the present AC inverter system 10 also includes an AC inverter 12, a DC source 14, and electric AC motors 16. The present AC inverter system 10 connects a plurality of AC motors 16 to at least one AC inverter 12. The AC inverter 12 of the present invention has a housing 18 that is connected to the master controller by an external CAN (Controller Area Network) connection 20 that alternately connects to a CAN interface 22 within the housing 18. The CAN interface 22 is electronically connected to a controller circuit 24 and a control power supply 26. The control power supply 26 is electrically connected to the positive copper bus bar 28 that is in communication with the positive battery connection 30 of the direct current source 14. Additionally, the positive battery connection 30 has a fuse 32. The positive copper bus bar 28 is electrically connected to the capacitor board 34 that additionally is electrically connected to the negative copper bus bar 36 that is in communication with the negative battery connection 38 of the DC source 14. Consequently, the DC source 14 is electrically connected to the transistor power module 40 of the present invention via the positive copper bus bar 28 and negative copper bus bar 36 that additionally places the capacity board 34 in parallel electrical connection with the transistor power module 40. Additionally, the controller circuit 24 is electrically connected to the transistor power module 40.

Figure 3:
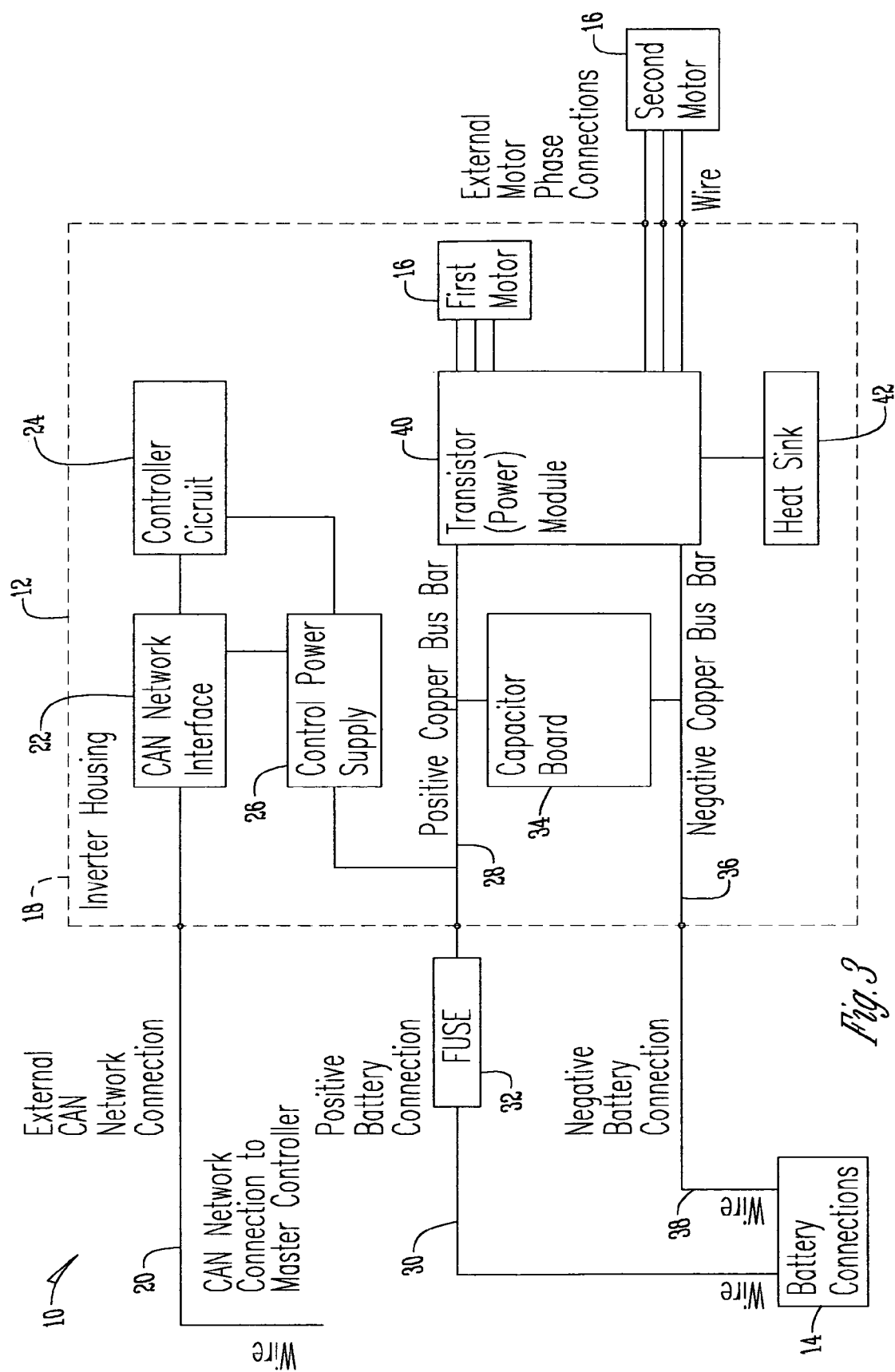
FIG. 3 is a schematic diagram of an alternative embodiment of an alternating current inverter system.
Figure 4:
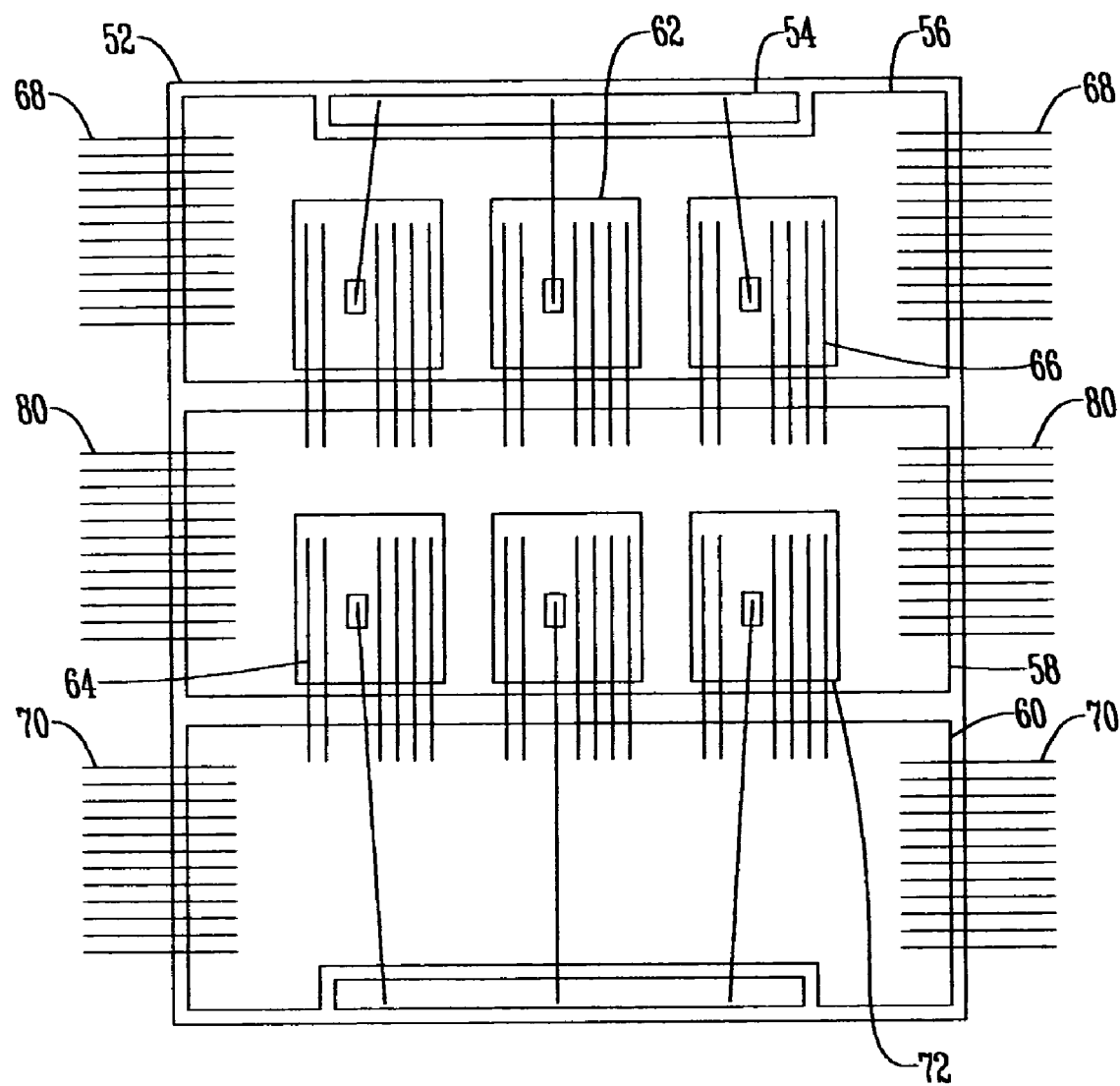
FIG. 4 is a schematic diagram of a mechanical layout of a substrate section from within a power module.

As best seen in FIG. 3, in an alternate embodiment an AC motor 16 can be incorporated within the housing 12 and operated by the transistor power module 40 while a second AC motor can be powered using external motor phase connections 42 remote to the housing 12. Thus, the inverter may be modified in relation to the motors 16 according to the need of an application.

Additionally, one skilled in the art will understand that the housing 12 can further contain a hydraulic pump. Thus, attached to the transistor power module 40 is a heat sink 44 for cooling the transistor power module 40. The heat sink 44 in one embodiment is the use of hydraulic fluid that absorbs heat that is being emitted by the transistor power module 40. Yet in another embodiment a mechanical thermostat can control the cooling aspects of the inverter 12.

The transistor power module 40 is specially designed to have power switching transistors installed therein such that the transistor power module 40 is able to power a plurality of AC motors 16 via motor phase connections 42 thus being operably connected to the motors 16. In one embodiment the power switching transistors are MOSFETS (metal oxide semi-conductor field effect transistors). In another embodiment the transistors are IGBTs (insulated gate bi-polar transistors).

A brief description is given here of power module substrate sections to more clearly differentiate the present invention from the prior art. A power module substrate section assembly 50 typically consists of a section of substrate 52 onto which several copper circuit traces (54, 56, 58, 60) are formed. A plurality of transistors 62 such as MOSFET chips are bonded to the copper traces on the substrate. A plurality of bonding wires 64, 66 are used to connect the power and gate regions of each transistor to the appropriate copper circuit trace. Additional bonding wires are used for voltage sensing and other purposes, several of which have been omitted from the drawings for clarity. (Note that in all power module drawings that bonding wires which connect the gates of the transistors to the external pins are omitted for clarity. Additional bonding wires such as voltage sense wires are also omitted for clarity.) In operation a first region such as the copper trace 56 will be connected to the positive connection of a direct current (DC) source such as a battery. A series of first bond wires 68 will connect the first copper circuit trace region to other substrate section assemblies 50 or to the external package connections which are depicted in FIGS. 5 through 9.

In a similar manner, a copper circuit trace region 60 is connected to a negative lead of the direct current source such as a battery. A plurality of second bonding wires 70 connect the negative circuit trace to other substrate section assemblies contained within a power module or to the package external terminals. A third main copper circuit trace 58 is also provided. This third copper circuit trace 58 is the output circuit trace of the power module. By alternately energizing positive side switching transistors 62 and negative side switching transistors 72 the power module output circuit trace region 58 is alternately connected to either the positive or negative battery leads. A single phase of a three phase alternating current is thus produced which is able to drive an alternating current electric motor.

Figure 5:
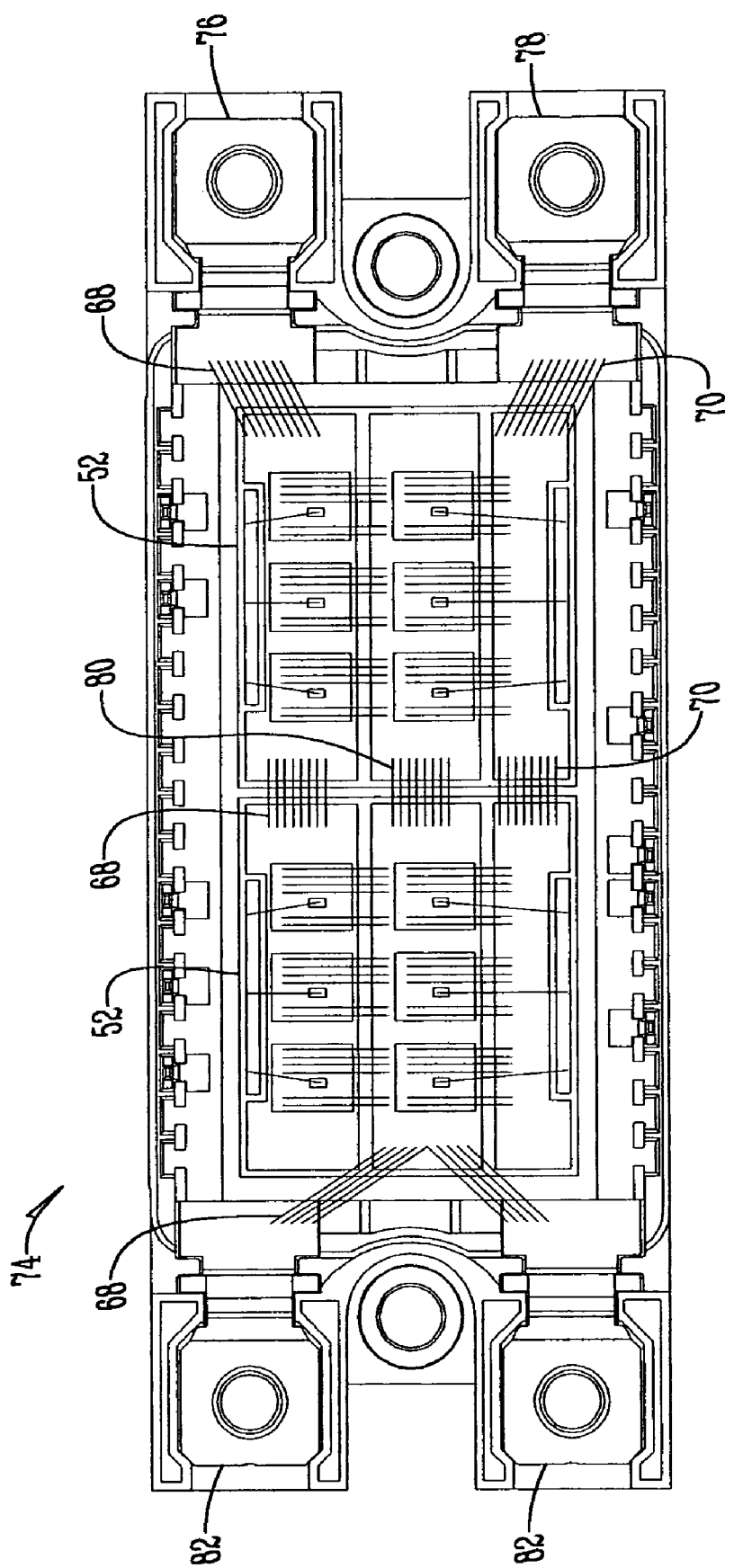
FIG. 5 is a schematic diagram of a mechanical layout of a half bridge power module.

FIG. 5 provides one example of a half bridge power module 74 that contains a plurality of substrate section assemblies 52. A plurality of first bonding wires 68 connect the positive circuit trace region to the adjacent substrate assembly and to the external package positive terminal 76. In a similar manner, a plurality of bond wires 70 connect the negative circuit trace to the negative external terminal 78 and to the negative circuit trace 60 of the adjacent module. A plurality of third bonding wires 80 connect the output circuit trace 58 to the output external package terminal 82 and also interconnect the output circuit traces 58 of adjacent substrate section assemblies.

Figure 6:
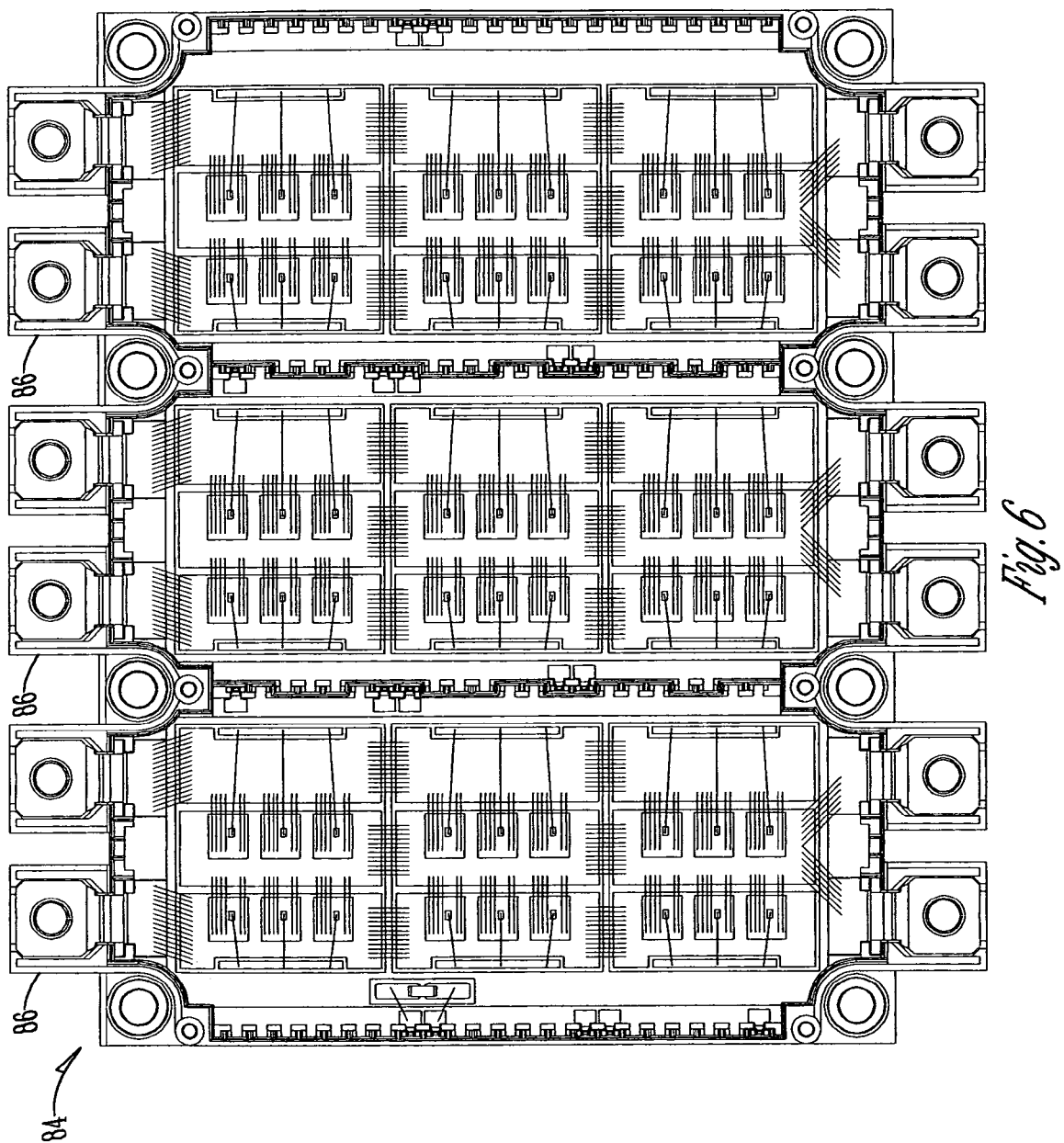
FIG. 6 is a schematic diagram of a mechanical layout of a three phase full bridge power module.

FIG. 6 shows three phase full bridge power module 84 that consists of three side by side single phase half bridge power module sections 86. In single motor three phase power modules as seen in FIG. 6, each phase half bridge incorporates three interconnected substrate section assemblies. The output circuit trace of all three substrate sections are interconnected with a plurality of bonding wires. As such, it is not possible to operate two of the substrate sections of each phase to power a separate motor. Thus, an alternate way of configuring a power module such that a single power module (or a single set of power modules in the case of half bridge power modules) is able to drive two electric motors rather than being limited to a single electric motor driven by a single power module must be provided.

Figure 7:
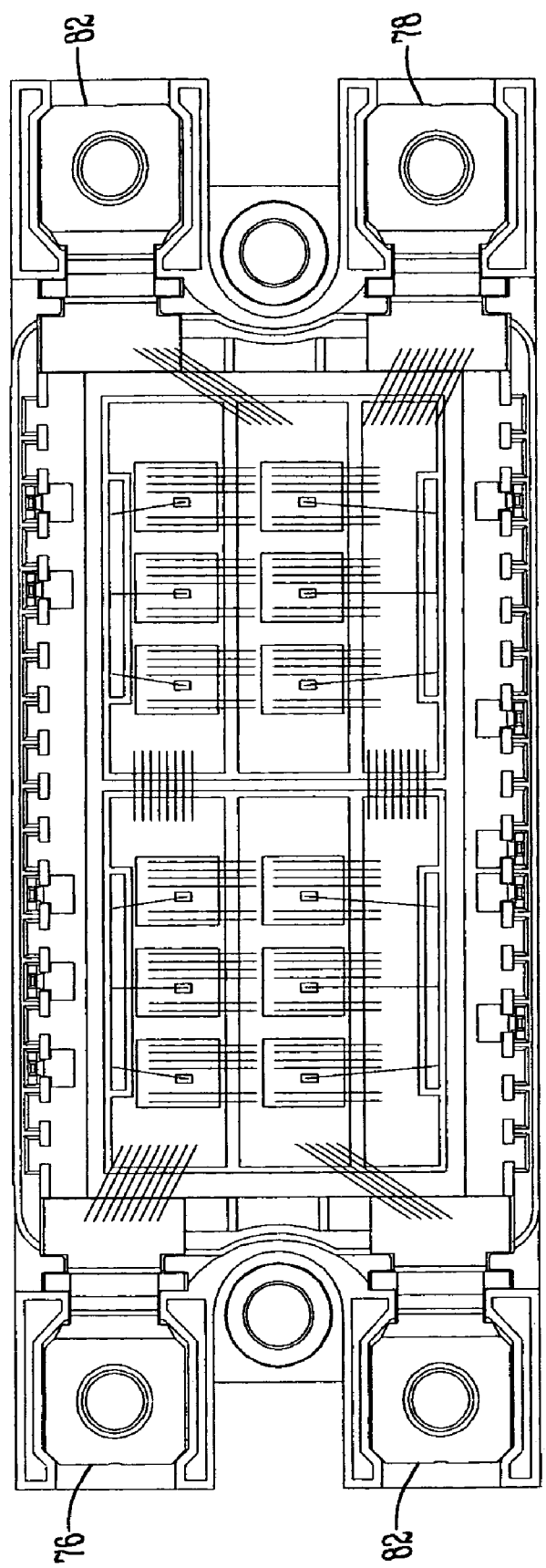
FIG. 7 is a schematic diagram of a mechanical layout of a dual half bridge power module.

As shown in FIG. 7 it is possible to omit a plurality of output trace bonding wires which would interconnect substrate section assemblies. The present invention teaches that doing so will produce a power module which incorporates two separate and independently drivable power stages which can be used to independently drive two different electric motors. Note that output terminals 82 of the power module in FIG. 7 are supplied by the same direct current source and occupy the same package but are driven by separate sets of transistors. As such a power module is created which can drive two electric motors. This is accomplished by positioning output terminals 82 on opposite corners of the power module in FIG. 7 rather than adjacent to each other as in FIG. 5.

Figure 8:
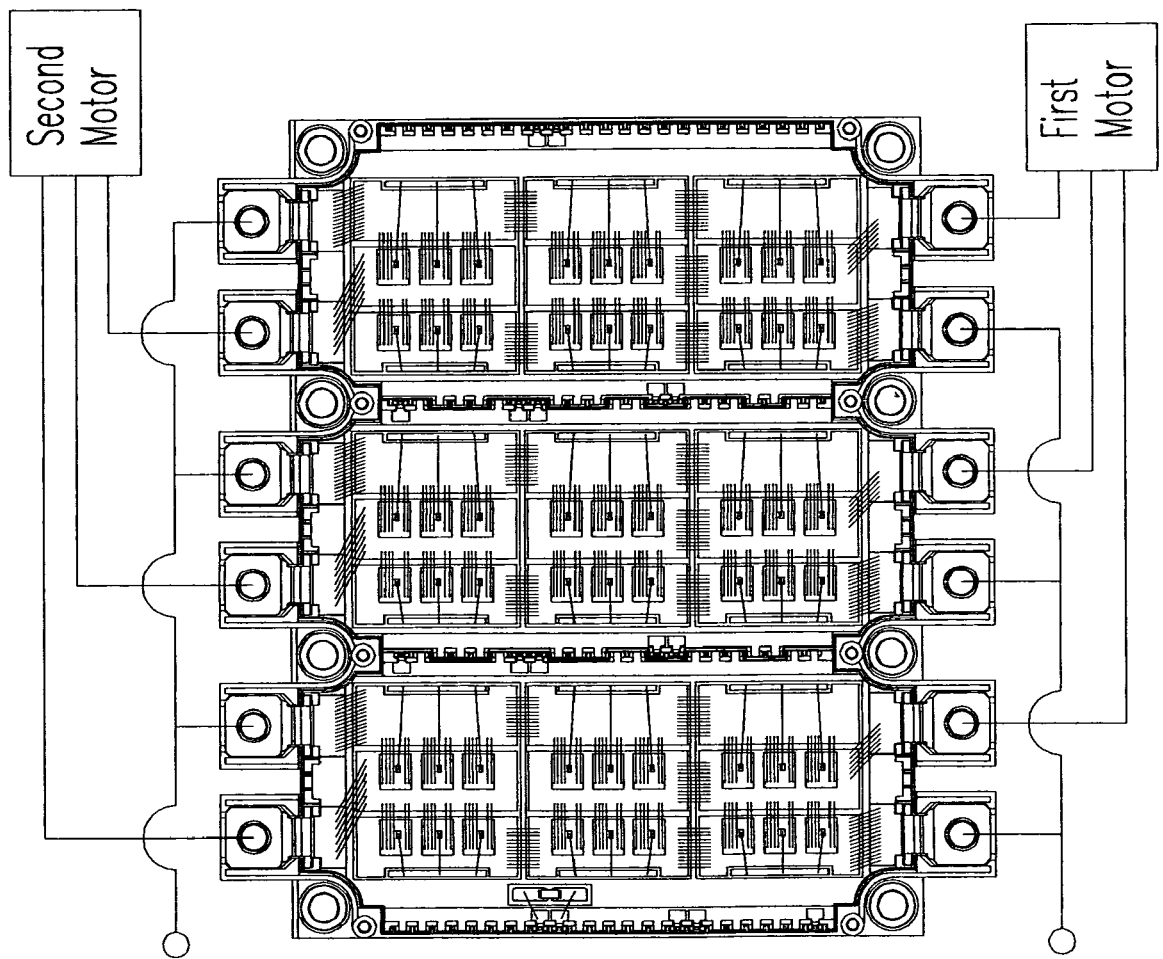
FIG. 8 is a schematic diagram of a mechanical layout drawing of a three phase full bridge power module of the present invention that is externally connected as a tandem inverter.
Figure 9:
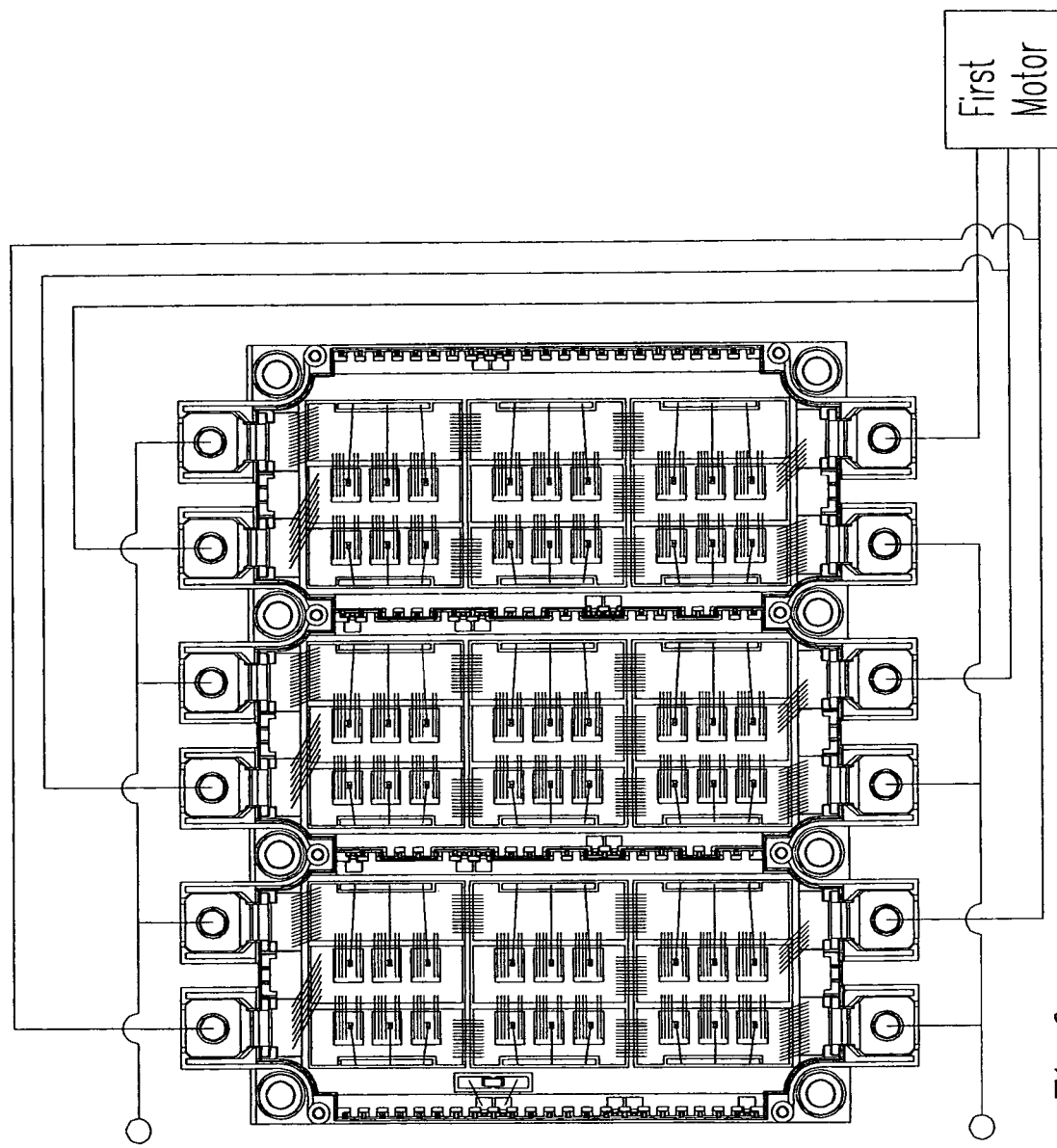
FIG. 9 is a schematic diagram of a mechanical layout of a three phase full bridge power module of the present invention that is externally connected as a high current single inverter.

As shown in FIG. 8 the power module of the new design can be extended to a three phase full bridge power module. FIG. 8 depicts how two substrate section assemblies in each phase are connected to a first electric motor while the remaining substrate section assembly in each phase is connected to a second and smaller electric motor. As such a tandem power module is produced that is capable of directing independent controllable power to two separate alternating current (AC) electric motors. Thus the module 40 is able to switch the current communicated to the electric motors 16. In another embodiment the power module 40 contains twelve terminals and is adapted to switch currents that are in communication with the electric motors 16. In this embodiment the module is able to also switch the current to a single electric motor. Finally, the tandem power module of FIG. 8 may be externally connected to form a single high current power module as seen in FIG. 9.

In a similar manner it is possible to produce a tandem or greater power stage for a multiple motor inverter with conventional printed circuit board technology which uses wither surface mount or discrete transistors. In another alternate embodiment of the present invention an IMS (Insulated Metal Substrate) power module can implement a tandem inverter power stage. Other circuit packaging strategies beyond power modules are also contemplated, including a series of thru-hole packaged transistors, or a series of transistors contained in surface mounted packages, without limit for implementing the tandem inverter of the present invention.

It is therefore seen that by connecting a plurality of alternating current motors to a single alternating current inverter, the present invention conserves space and resources, thereby accomplishing at least all of the stated objectives.

It will be appreciated by those skilled in the art that other various modifications could be made to the device without the parting from the spirit in scope of this invention. All such modifications and changes fall within the scope of the claims and are intended to be covered thereby.

What is claimed is:

1. An alternating current inverter comprising:
   a housing;
   a power module within the housing;
   a direct current source in electrical communication with the housing;
   a plurality of electric motors in electrical communication with the power module; and
   the power module having two separate and independently drivable power stages for driving the electric motors;
   wherein the housing further contains a hydraulic pump; and the inverter is cooled by hydraulic fluid.

2. The device of claim 1 wherein at least one of the power stages is an insulated metal substrate.

3. The device of claim 1 wherein at least one of the power stages comprises a series of thru-hole packaged transistors.

4. The device of claim 1 wherein at least one of the power stages comprises a series of transistors contained in surface mounted packages.

5. The device of claim 1 wherein the power module switches currents that are in communication with the electric motors.

6. The device of claim 1 wherein the power module has twelve terminals and switches currents that are in communication with the electric motors.

7. The device of claim 1 wherein at least one of the electric motors is an alternating current motor.

8. The device of claim 1 wherein at least one electric motor is operated as an electrical generator.

9. The device of claim 1 wherein the direct current source is a lead acid battery.

10. The device of claim 1 wherein the direct current source is a fuel cell.

11. The device of claim 1 wherein the direct current source is a hybrid direct current power source.

12. The device of claim 1 wherein the motors are remotely located from the housing.

13. The device of claim 1 wherein at least one motor is disposed within the housing.

14. The device of claim 1 wherein the power module has a plurality of power switching transistors installed therein.

15. The device of claim 14 wherein at least one transistor is a MOSFETs.

16. The device of claim 14 wherein at least one transistor is an IGBTs.

17. A method of inverting direct current into alternating current comprising the steps of:
    providing an alternating current inverter that is in electrical communication with a direct current source;
    providing a power module within the inverter; connecting a plurality of electric motors to the inverter; and
    providing a power module that has two separate and independently drivable power stages for driving the electric motors; and
    cooling the inverter with hydraulic fluid.

* * * * *